(12) United States Patent
Calafut et al.

(10) Patent No.: US 9,673,289 B2
(45) Date of Patent: Jun. 6, 2017

(54) DUAL OXIDE TRENCH GATE POWER MOSFET USING OXIDE FILLED TRENCH

(71) Applicant: Alpha and Omega Semiconductor Incorporated, Sunnyvale, CA (US)

(72) Inventors: Daniel Calafut, San Jose, CA (US); Madhur Bobde, Santa Clara, CA (US); Yeeheng Lee, San Jose, CA (US); Hong Chang, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/880,886

(22) Filed: Oct. 12, 2015

(65) Prior Publication Data
US 2016/0099325 A1    Apr. 7, 2016

Related U.S. Application Data

(63) Continuation of application No. 14/138,103, filed on Dec. 22, 2013, now Pat. No. 9,190,478.

(51) Int. Cl.
| | |
|---|---|
| *H01L 29/423* | (2006.01) |
| *H01L 29/49* | (2006.01) |
| *H01L 29/66* | (2006.01) |
| *H01L 29/78* | (2006.01) |
| *H01L 29/872* | (2006.01) |

(52) U.S. Cl.
CPC .... *H01L 29/42368* (2013.01); *H01L 29/4236* (2013.01); *H01L 29/4916* (2013.01); *H01L 29/66666* (2013.01); *H01L 29/7813* (2013.01); *H01L 29/7827* (2013.01); *H01L 29/8725* (2013.01)

(58) Field of Classification Search
None
See application file for complete search history.

(56) References Cited

U.S. PATENT DOCUMENTS

| | | | |
|---|---|---|---|
| 2003/0073287 A1* | 4/2003 | Kocon | H01L 29/404 438/259 |
| 2007/0194374 A1* | 8/2007 | Bhalla | H01L 29/407 257/330 |
| 2011/0037120 A1* | 2/2011 | Chen | H01L 29/407 257/331 |

* cited by examiner

*Primary Examiner* — Michael Jung
*Assistant Examiner* — Jay C Chang
(74) *Attorney, Agent, or Firm* — Van Pelt, Yi & James LLP

(57) ABSTRACT

A power MOSFET device including a semiconductor layer, an active trench formed in the semiconductor layer and housing a dual oxide thickness trench gate structure where a bottom of the trench gate is isolated from a bottom of the active trench by a liner oxide layer having a first thickness, and a termination trench formed in the semiconductor layer apart from the active trench and housing a dual oxide thickness trench gate structure where a bottom of the trench gate is isolated from a bottom of the termination trench by the liner oxide layer having a second thickness. In one embodiment, the second thickness is greater than the first thickness. In another embodiment, the trench gate in each of the active trench and the termination trench is formed as a single polysilicon layer.

20 Claims, 10 Drawing Sheets

DUAL OXIDE TRENCH GATE POWER MOSFET USING OXIDE FILLED TRENCH

CROSS REFERENCE TO OTHER APPLICATIONS

This application is a continuation of U.S. patent application Ser. No. 14/138,103, entitled METHOD FOR FORMING DUAL OXIDE TRENCH GATE POWER MOSFET USING OXIDE FILLED TRENCH, filed Dec. 22, 2013, now U.S. Pat. No. 9,190,478, which is incorporated herein by reference for all purposes.

BACKGROUND OF THE INVENTION

Power metal-oxide-silicon field-effect transistors (MOSFET) are employed in applications requiring high voltages and high currents. One type of Power MOSFETs uses a trench gate structure where the transistor gate is provided in a vertical trench formed at the surface of the substrate. The trench gate is isolated from the substrate by a gate oxide layer lining the sidewall and the base of the trench. The source and body regions are formed adjacent the trench at the surface of the substrate and the drain region is formed on the opposite surface of the substrate. As thus configured, the channel of the transistor is formed in body region along the vertical sidewall of the trench. Power MOSFETs using a trench gate are sometimes referred to as trench MOSFETs, or trench gate power MOSFETs, or trench-gated vertical power MOSFET.

In some applications, trench gate power MOSFET devices benefit from using a dual oxide thickness trench gate structure. In a dual oxide thickness trench gate structure, the trench gate is formed in a trench lined with a liner oxide layer at a bottom portion of the trench that is thicker than the thin gate oxide layer at the top portion of the trench. FIG. 1 duplicates FIG. 3N of commonly assigned U.S. patent application Ser. No. 13/776,523 and illustrates an example of a dual oxide thickness trench gate structure for a trench gate power MOSFET device. U.S. patent application Ser. No. 13/776,523 is entitled "Termination Trench For Power MOSFET Applications," filed Feb. 25, 2013, and is incorporated herein by reference in its entirety. Conventional fabrication processes for forming the dual oxide thickness trench gate structure involve forming a trench in the silicon substrate to a first depth, forming a nitride spacer on the sidewalls of the trench, and then etching the silicon substrate in the trench further to a second depth using the nitride spacer as a self-aligned mask. Then, the conventional processes perform thermal oxidation to grow the liner oxide layer at the bottom portion of the trench. The nitride spacer is removed and thermal oxidation is performed to grow the gate oxide layer at the top portion of the trench.

Challenges exist in forming the dual oxide thickness trench gate structure. For example, particle debris may become lodged in the bottom of the trench during the second trench etch process. The particle debris inhibits the liner oxidation and causes shorts between the trench gate and the silicon substrate.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a method for forming a dual oxide thickness trench gate structure for a power MOSFET device involves providing a trench that is partially filled with an oxide layer, forming a nitride spacer above the oxide layer in the trench, and using the nitride spacer as a self-aligned mask to etch the partially filled oxide layer. The remaining portion of the oxide layer not etched becomes the liner oxide layer at the bottom portion of the trench. As thus configured, the trench structure is formed using a single trench etch in the silicon substrate. Furthermore, the liner oxide is formed by masking and etching instead of thermal oxidation which provides greater control of the thickness of the liner oxide. Also, the oxide layer fills the bottom portion of the trench and thereby protects the trench from contamination debris from subsequent etching process. Lastly, by eliminating the thermal oxidation process for the liner oxide, the total thermal budget of the power MOSFET fabrication process is decreased. It is thus possible to change the thickness of the line oxide layer without altering the thermal budget of the entire process.

Figure 1:
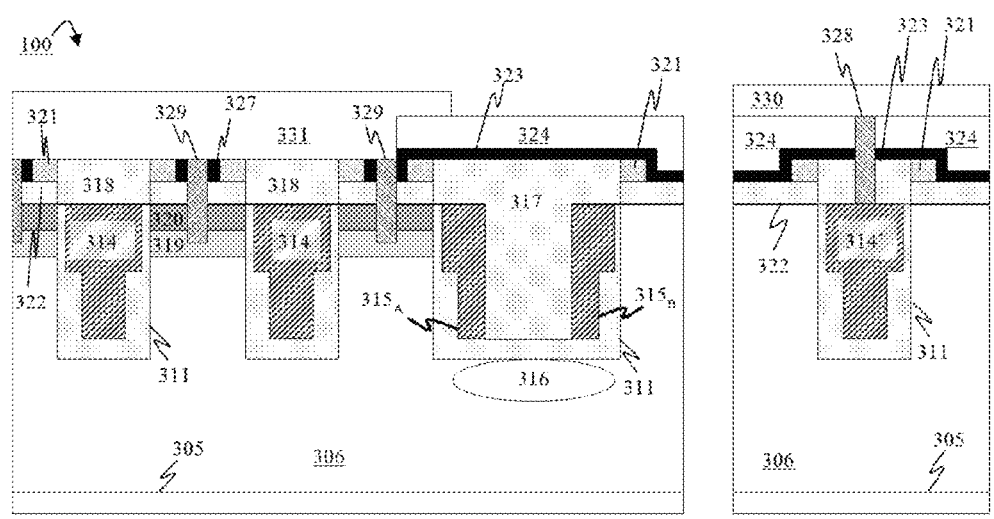
FIG. 1 duplicates FIG. 3N of commonly assigned U.S. patent application Ser. No. 13/776,523 and illustrates an example of a dual oxide thickness trench gate structure for a trench gate power MOSFET device.
Figure 2:
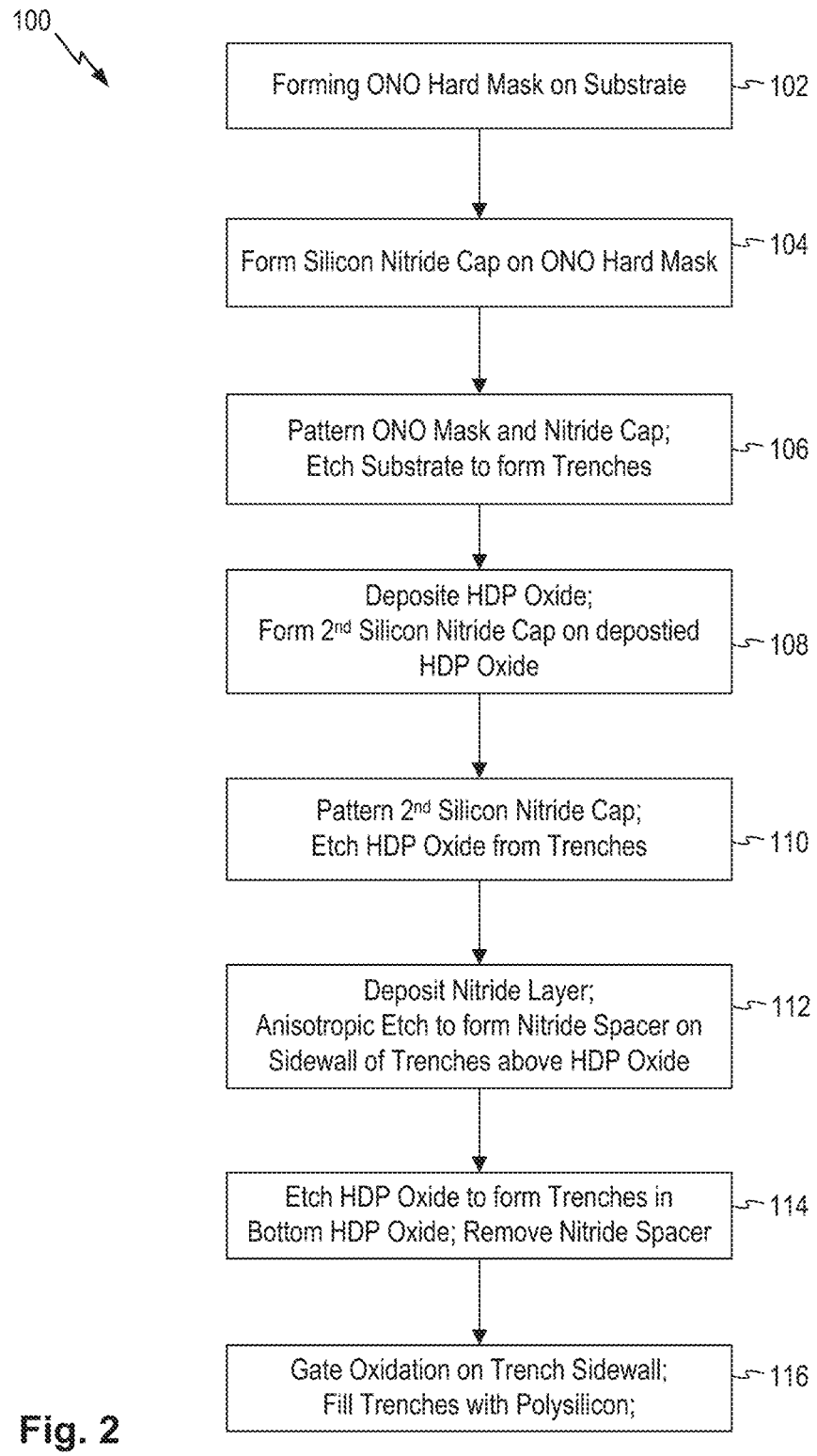
FIG. 2 is a flow chart illustrating a method for forming a dual oxide thickness trench gate structure in a power MOSFET according to one embodiment of the present invention.
Figure 3A:
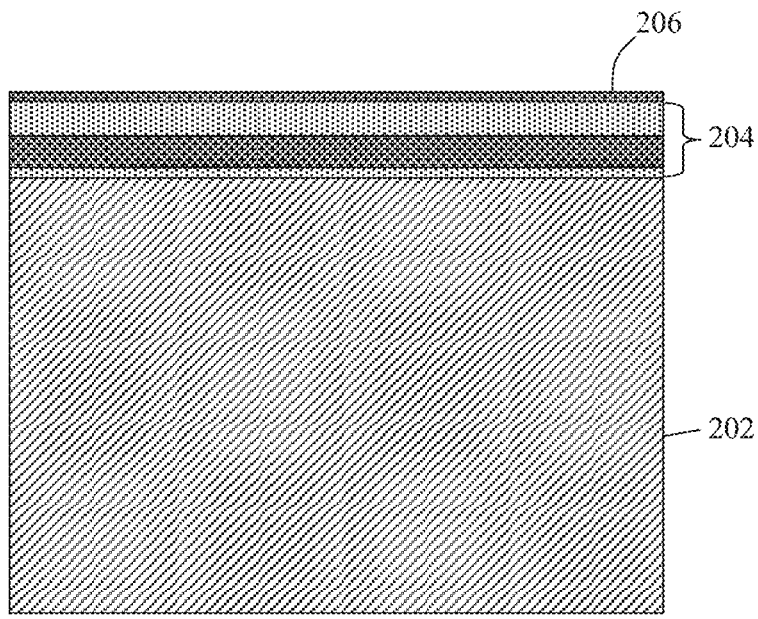
FIGS. 3(a) to 3(m) are cross-sectional views of a trench gate power MOSFET device illustrating the processing steps for forming the dual oxide thickness trench gate structure according to embodiments of the present invention.

FIG. 2 is a flow chart illustrating a method for forming a dual oxide thickness trench gate structure in a power MOSFET according to one embodiment of the present invention. The process shown in the flow chart of FIG. 2 will be described with reference to FIGS. 3(a) to 3(m) which are cross-sectional views of a trench gate power MOSFET device illustrating the processing steps for forming the dual oxide thickness trench gate structure according to embodiments of the present invention. In embodiments of the present invention, the power MOSFET device is formed in a semiconductor substrate 202, as shown in FIG. 3(a). The semiconductor substrate 202 may be an N-type substrate or a P-type substrate. In the present embodiment, it is assumed that the power MOSFET is an N-type transistor and the substrate 202 is thus an N-type silicon substrate. The substrate 202 forms a lightly doped drift region of the power MOSFET device. A heavily doped drain contact region (not shown) may be formed on the bottom portion of the semiconductor substrate 202.

Referring to FIG. 2, a method 100 for forming a dual oxide thickness trench gate structure in the power MOSFET device starts at 102 by forming an oxide-nitride-oxide (ONO) hard mask layer 204 on the top of the substrate 202. In one example, the ONO hard mask layer 204 may include a bottom oxide layer of 250 Å, a nitride layer of 1400 Å and a top oxide layer of 1400 Å. Then, at 104, a first silicon nitride cap layer 206 ("first nitride cap layer") is formed on the ONO hard mask layer 204. In other embodiments, the first nitride cap layer 206 may be formed using other suitable dielectric materials.

Figure 3B:
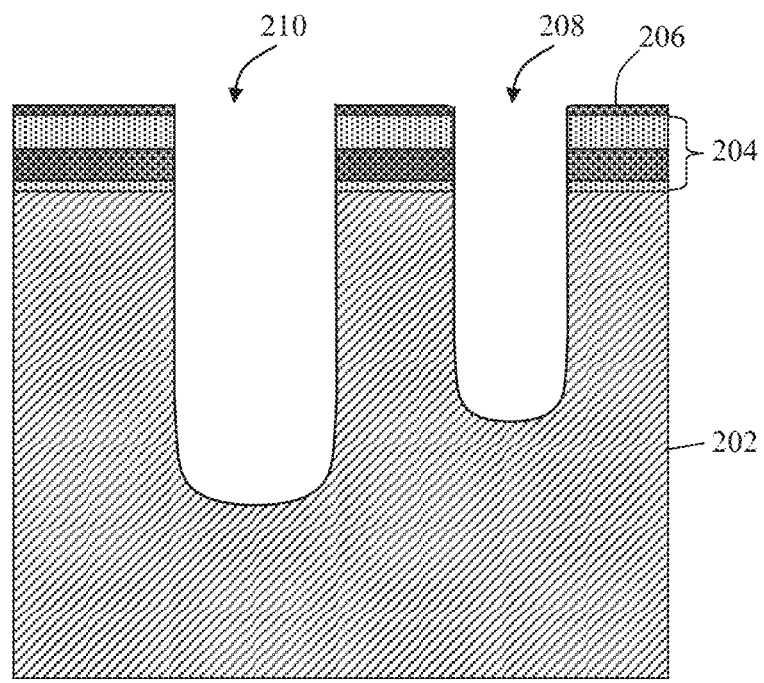

At 106, the ONO hark mask layer 204 and the first nitride cap layer 206 is patterned, such as using a trench mask, to define areas where trenches are to be formed. The first nitride cap layer 206 and the ONO hard mask layer 204 are removed to expose the top surface of the substrate 202 where trenches are to be formed. Then, the substrate 202 is etched to form trenches 208 and 210, as shown in FIG. 3(b). Trench 208 is formed in an active region of the power MOSFET device and is used to form an active cell of the power MOSFET device. Trench 210 is a termination trench formed outside of the active region around the edge of the semiconductor substrate 202 and is used to form a termination structure of the power MOSFET device. In the present illustration, the termination trench 210 has a wider width and a deeper depth than the active trench 208.

Figure 3C:
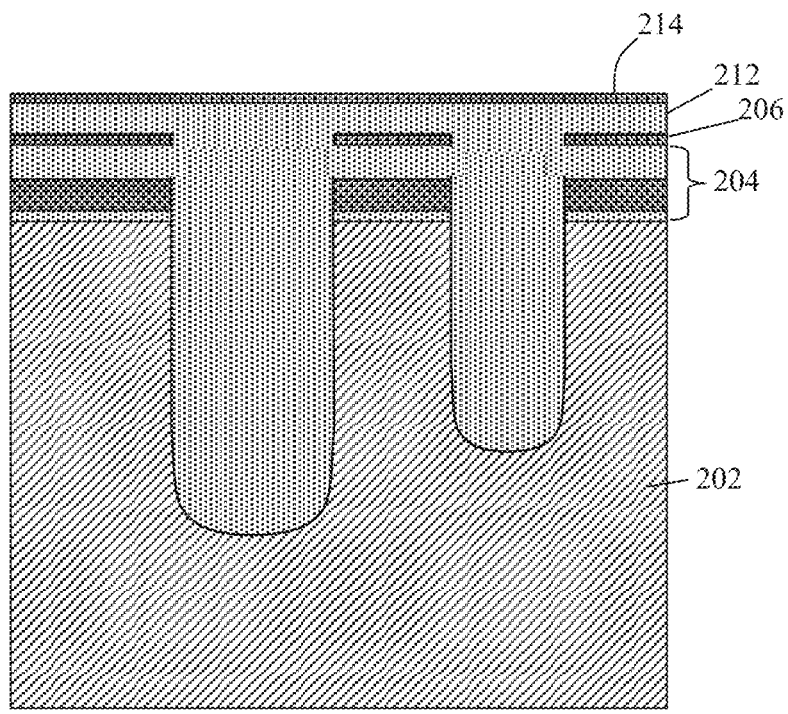

At 108, an oxide layer 212 is deposited onto the semiconductor structure of FIG. 3(b). In particular, the oxide layer 212 is deposited into the trenches 208, 210 and also over the top surface of the first nitride cap layer 206, as shown in FIG. 3(c). In one embodiment, the oxide layer 212 is a high density plasma (HDP) oxide layer. In other embodiments, other types of deposited oxide layer may be used. Then, a second silicon nitride cap layer 214 ("second nitride cap layer") is formed on the top surface of the deposited oxide layer 212, as shown in FIG. 3(c).

Figure 3D:
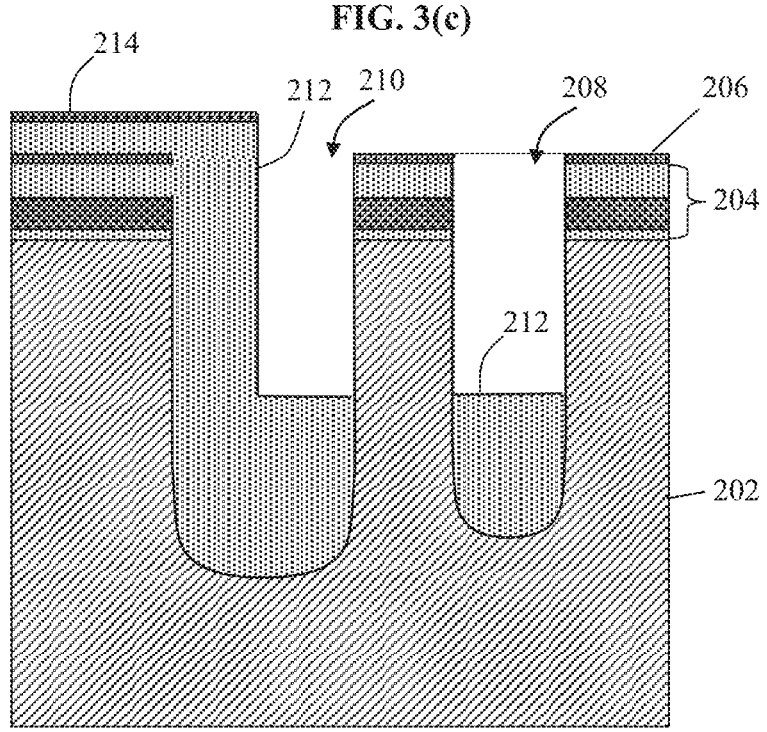

At 110, the second nitride cap layer 214 is patterned to define areas where the trench gate is to be formed subsequently. In other words, the second nitride cap layer 214 is patterned to define areas or trenches which will receive the polysilicon deposition subsequently. In one embodiment, the second nitride cap layer 214 is patterned by a polysilicon cover mask and the second nitride cap layer 214 is removed from areas that will receive the polysilicon deposition. With the second nitride cap layer 214 thus patterned and using the second nitride cap layer 214 as a mask, the oxide layer 212 is etched. After the oxide etch process, the oxide layer 212 within the active trench 208 is removed to a first depth d1, as shown in FIG. 3(d). At the termination trench 210, the second nitride cap layer 214 extends partially over the trench opening so that only a portion of the oxide layer 212 is removed from the termination trench 212. A thick sidewall of oxide layer 212 remains under the overhanging portion of the second nitride cap layer 214, as shown in FIG. 3(d). The thick oxide sidewall in the termination trench 210 provides isolation and edge termination functions.

Figure 3E:
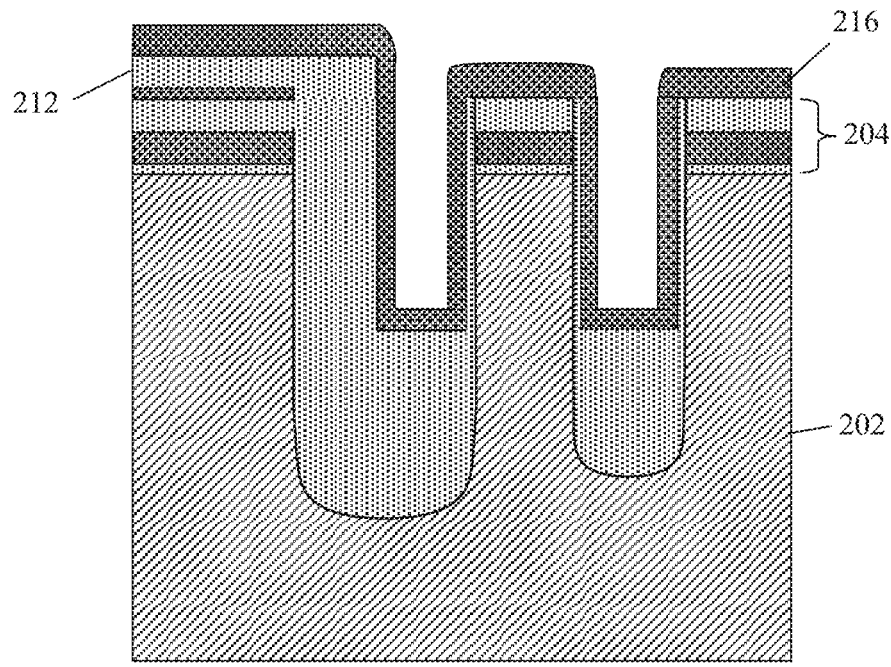
Figure 3F:
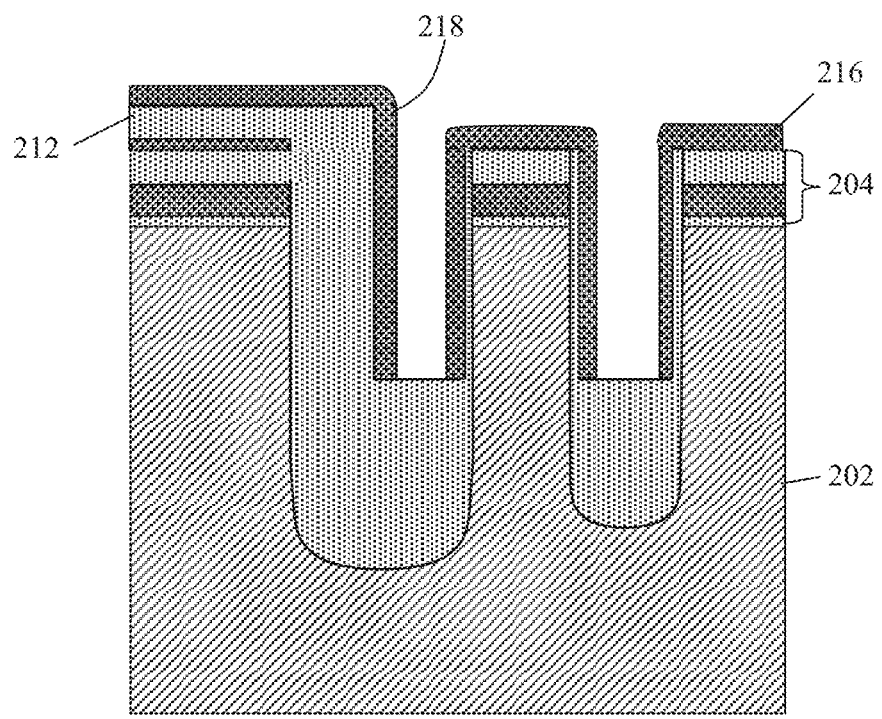

At 112, a pad oxide layer is grown on the exposed silicon surface. Then, a conformal silicon nitride layer 216 is deposited over the semiconductor structure, as shown in FIG. 3(e). The conformal silicon nitride layer 216 is anisotropically etched so that nitride spacers 218 are formed along the sidewalls of the trenches 208, 210, as shown in FIG. 3(f). The nitride spacers 218 thus formed are positioned above the oxide layer 212. The anisotropic etching removes the nitride layer 216 and exposes a portion of the oxide layer 212 between the nitride spacers 218.

Figure 3G:
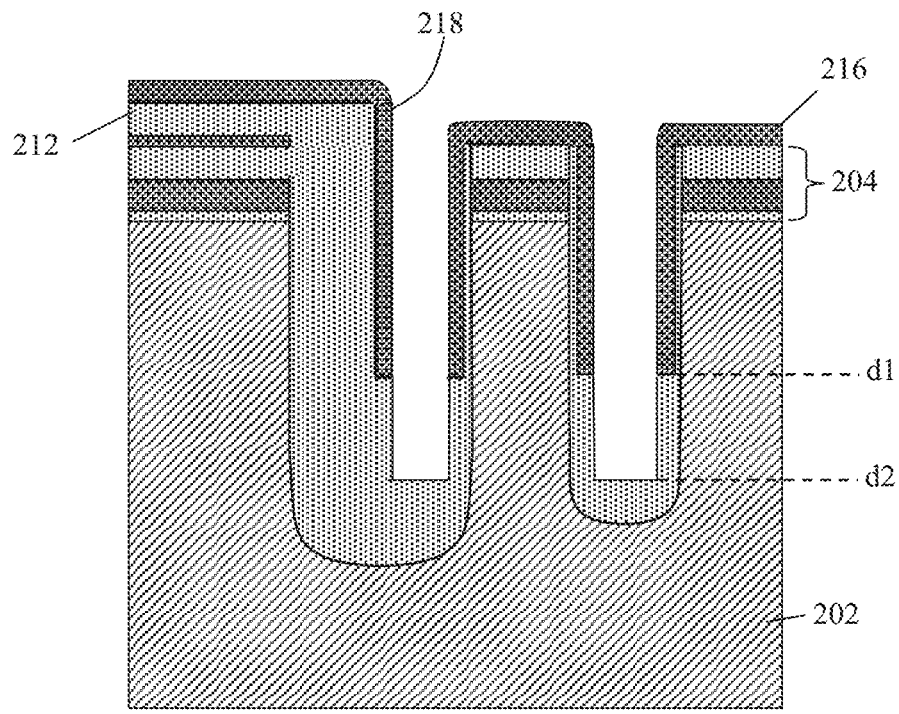
Figure 3H:
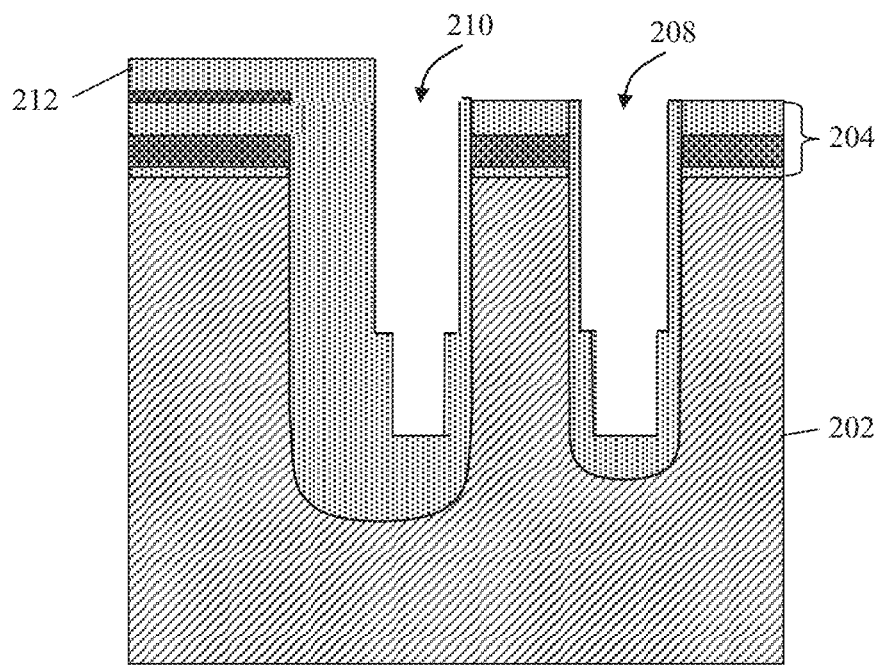

At 114, the exposed oxide layer 212 in the trenches 208, 210 is etched to a second depth d2, as shown in FIG. 3(g). Meanwhile, the oxide layer 212 that is protected by the nitride spacers 218 and the bottom portion of the oxide layer 212 in the trench remain to form the liner oxide layer. Then the nitride spacers 218 are removed. The resulting oxide thickness trench structure is shown in FIG. 3(h). In other words, the nitride spacers 218 are used to etch trenches in the oxide layer 212 so as to form the liner oxide layer in the bottom portion of the trenches.

Figure 3I:
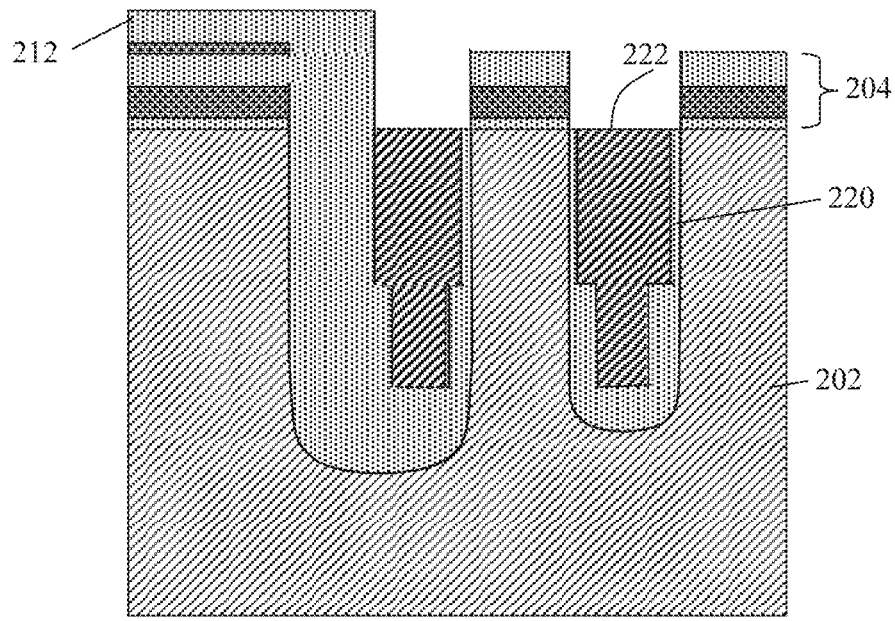

At 116, the pad oxide layer is removed and gate oxidation is performed on the semiconductor structure of FIG. 3(h) to grow a gate oxide layer 220 on the sidewalls of the trenches 208, 210. The gate oxide layer is primarily formed on the exposed silicon trench sidewalls above the liner oxide layer. The trenches 208, 210 are then filled with a polysilicon layer 222, as shown in FIG. 3(i). The polysilicon layer forming the gate electrode of the power MOSFET to be formed.

As thus configured and shown in FIG. 3(i), a dual oxide thickness trench gate structure is formed where a polysilicon trench gate is formed in a trench and is isolated from the silicon substrate by a thin gate oxide layer formed in an upper portion of the trench and a thicker liner oxide layer formed in the bottom portion of the trench. The thicker liner oxide is formed by etching of an oxide layer formed in the trench. The bottom portion of the trench is protected by the oxide layer during the etching process so that any etch debris that may fall into the trench during etching will land on the oxide layer and therefore isolated from the substrate and will not cause device failure. Furthermore, the sidewall thickness of the liner oxide layer is determined by the thickness of the conformal nitride layer used to form the nitride spacers. Thus, the thickness of the liner oxide layer can be well controlled and also can be varied without disturbing the thermal budget of the fabrication process. The bottom thickness of the liner oxide layer is determined by the oxide etch process and can be precisely controlled.

Figure 3J:
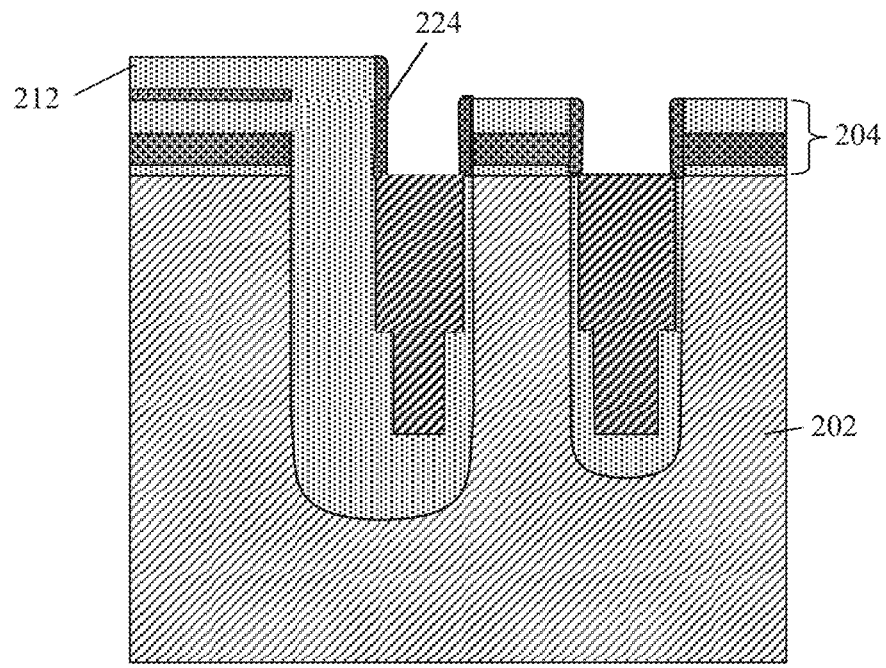
Figure 3K:
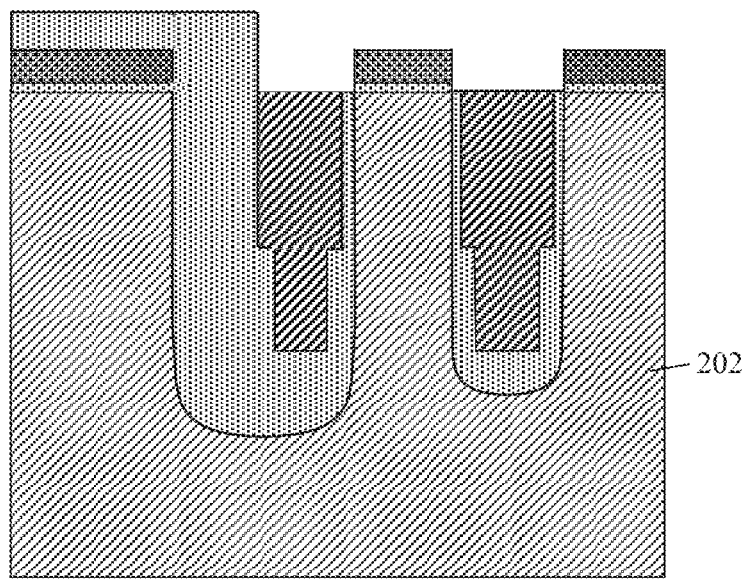
Figure 3L:
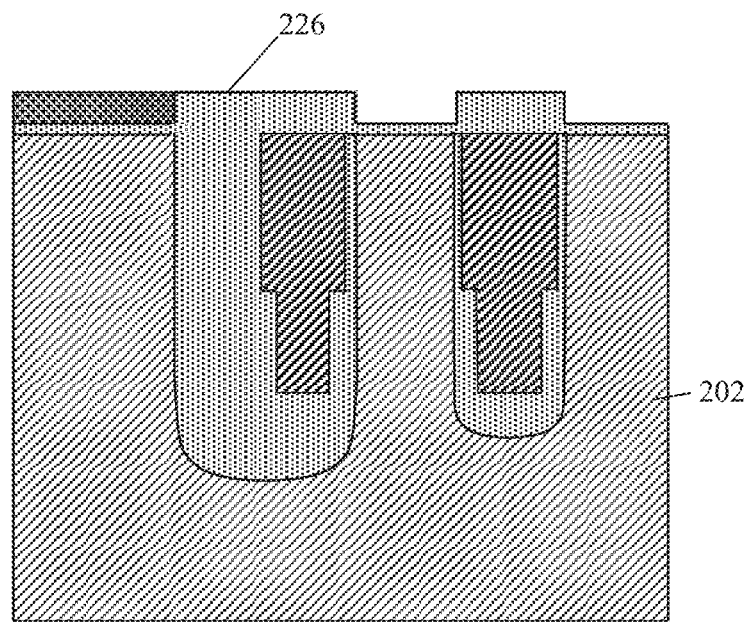
Figure 3M:
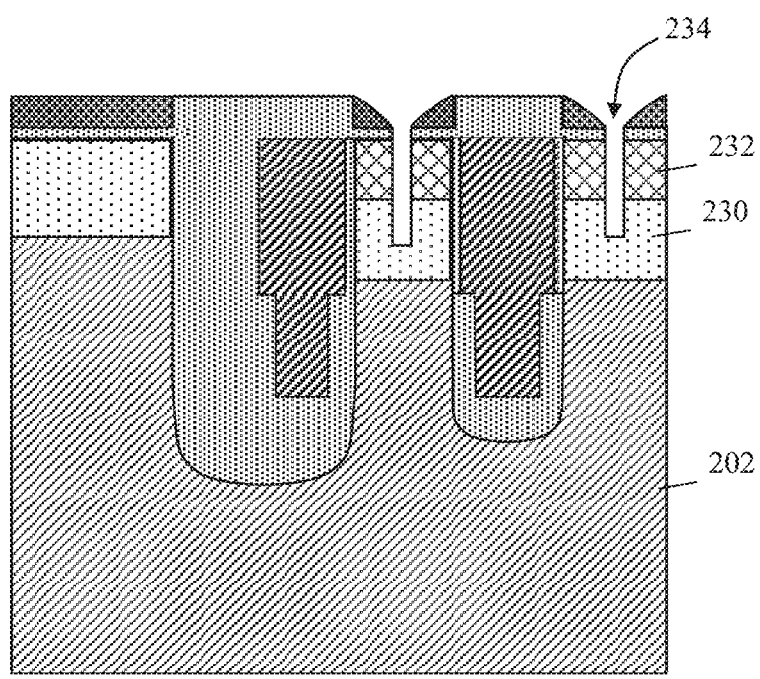

In embodiments of the present invention, the fabrication process for the power MOSFET continues to complete the transistor device. FIGS. 3(j) to 3(m) illustrate the remaining processing steps to complete the power MOSFET device in some examples of the present invention. Referring to FIG. 3(j), nitride spacers 224 are formed adjacent the ONO hard mask layer 204 and over the polysilicon filled trenches. At the edge termination cell, the nitride spacer extends to the top of the HDP oxide layer above the ONO hard mask layer 204. Then, an oxide etch process is carried out to remove the top oxide layer of the ONO hard mask layer 204, as shown in FIG. 3(k).

Then, oxide deposition is performed to deposit an oxide layer 224 on the semiconductor structure of FIG. 3(k). Then the structure is planarization to the top of the silicon nitride layer in the ONO hard mask layer 204. The nitride layer in the ONO hard mask above the mesa is then removed, resulting in the structure shown in FIG. 3(*l*). In one embodiment, the polysilicon cover mask used in the oxide etch processing step is applied here again to cover the edge termination cells while exposing the active cell mesas for the nitride strip process.

Finally, a well ion implantation process is carried out to form a doped region in the active cell mesa to function as the body region 230 of the power MOSFET. In the present illustration, the well implant is a P-type implant. A source ion implantation process is carried out to form a doped region in the active cell mesa to function as the source region 232 of the power MOSFET. In the present illustration, the source implant is an N-type implant. After the source and body regions are formed, an insulating layer is deposited onto the semiconductor structure and contacts to the source region 232 and body region 230 are then formed. Various processes can be used to form the source and body contacts. In the example shown in FIG. 3(*m*), a self-aligned process is used to form the source/body contact 234. FIG. 3(*m*) illustrates the power MOSFET formed using the dual oxide thickness gate trench structure according to embodiments of the present invention.

ALTERNATE EMBODIMENTS

In the above described embodiments, a silicon nitride layer is used to form the spacers for etching the oxide trench in the oxide layer 212. In other embodiments, the spacers can be formed using other dielectric materials, such as silicon oxide.

Figure 4:
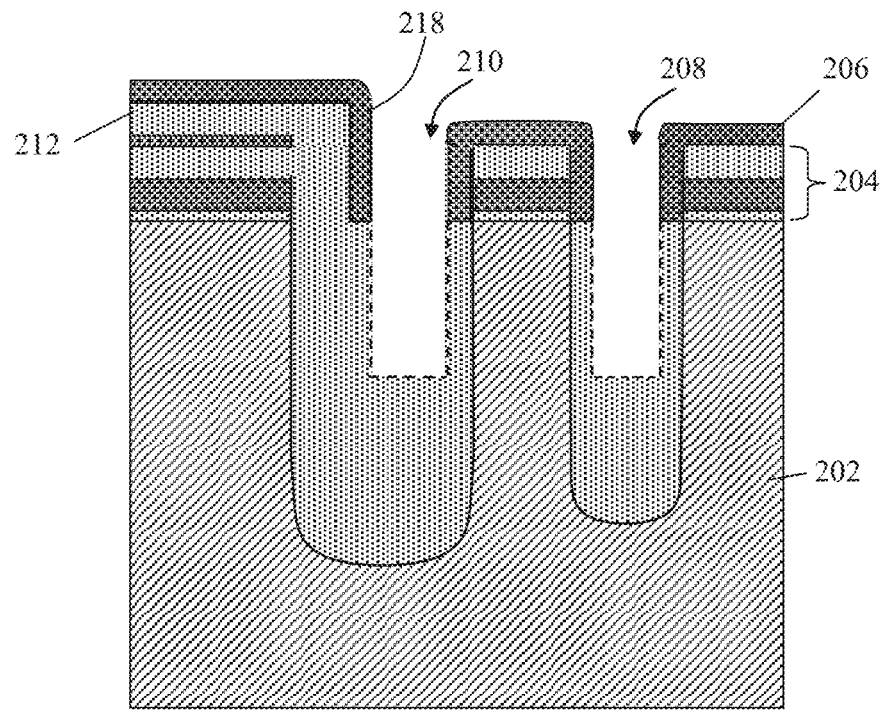
FIG. 4 is a cross-sectional view of a single oxide thickness trench structure formed using the trench oxide etch method according to an alternate embodiment of the present invention.

In the above description, the method for forming a dual oxide thickness trench gate structure in a power MOSFET uses a nitride spacer formed in a trench partially filled with an oxide layer to etch the oxide layer. The method can be referred to as a trench oxide etch method as the oxide layer in the trench is etched against a nitride spacer. By using a partially filled trench, a dual oxide thickness trench structure is formed. In other embodiments of the present invention, the method can be applied to form a trench structure with a single oxide thickness. FIG. 4 is a cross-sectional view of a single oxide thickness trench structure formed using the trench oxide etch method according to an alternate embodiment of the present invention. Referring to FIG. 4, to form a trench with a single oxide thickness, the trenches 208 and 210 are filled with an oxide layer 212 and the oxide layer is etched to the top of the trenches only. Then, the nitride spacer 218 is formed along the side of the ONO hard mask layer 206 and the first nitride cap layer 206. Then, the exposed oxide layer 212 can be etched to form a liner oxide layer in the trenches having a single oxide thickness throughout the trenches.

Figure 5:
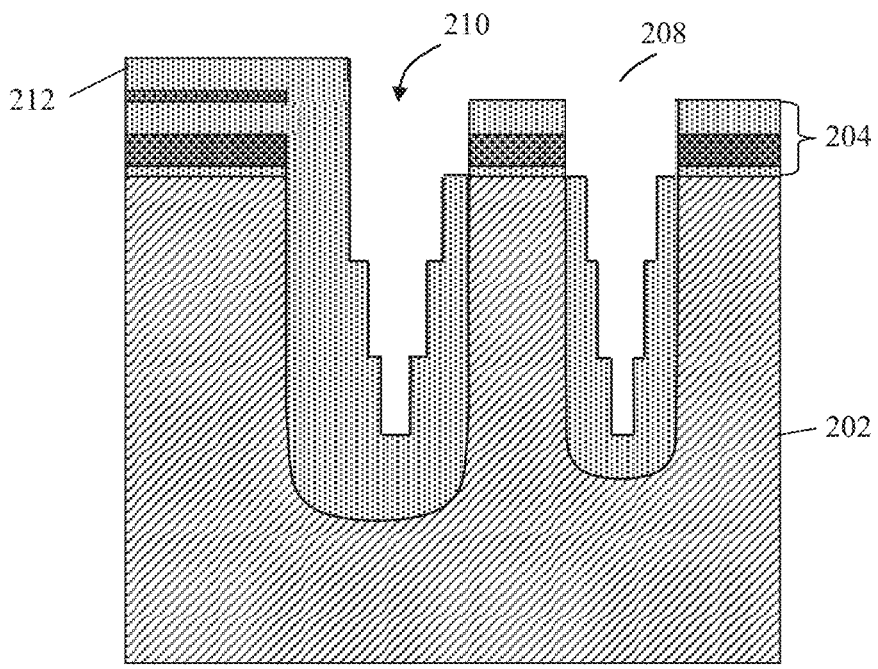
FIG. 5 is a cross-sectional view of a multi-oxide thickness trench structure formed using the trench oxide etch method according to an alternate embodiment of the present invention.

Alternately, the trench oxide etch method of the present invention can be applied to form trench structures with multiple oxide thicknesses. FIG. 5 is a cross-sectional view of a multi-oxide thickness trench structure formed using the trench oxide etch method according to an alternate embodiment of the present invention. Referring to FIG. 5, the nitride spacer and oxide etch process is repeated one or more times to form a staggered oxide structure in the trenches 208, 210.

In yet other embodiments of the present invention, the trench oxide etch method can be used to form dummy trenches that are either oxide filled or polysilicon filled.

Lastly, in some embodiments, a Schottky diode can be formed by omitting the body and source implants and overlaying the mesas with a Schottky metal.

The trench oxide etch method of the present invention provides many advantages. First, because the liner oxide is formed by masking and etching instead of thermal oxidation, the method provides greater control of the thickness of the liner oxide. The liner oxide thickness is controlled by the thickness of the nitride spacer layer. Second, by using an etch process to form the liner oxide instead of an oxidation process used in the conventional processes, the thermal budget for the entire device is reduced. Third, the edge trench structure is self-terminating. By using masking, a thick oxide is formed automatically at the edge termination cells. Edge termination is provided without additional processing steps.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A power metal-oxide-silicon field effect transistor (MOSFET) device, comprising:
   a semiconductor layer of a first conductivity type;
   an active trench formed in the semiconductor layer, the active trench having a first trench depth and housing a dual oxide thickness trench gate structure including a first trench gate formed in the active trench, the first trench gate being isolated from a sidewall of the semiconductor layer by a gate oxide layer in an upper portion of the active trench and being isolated from the sidewall of the semiconductor layer by a first liner oxide layer in a bottom portion of the active trench, the first liner oxide layer being formed between the first trench gate and the sidewall of the semiconductor layer in a lateral direction, the first liner oxide layer being thicker than the gate oxide layer, a bottom of the first trench gate being isolated from a bottom of the active trench by the first liner oxide layer having a first thickness; and
   a termination trench formed in the semiconductor layer apart from the active trench, the termination trench having a second trench depth deeper than the first trench depth and housing a dual oxide thickness trench gate structure including a second trench gate formed in the termination trench, the second trench gate being isolated from the sidewall of the semiconductor layer on a first side of the termination trench by a first sidewall oxide layer in an upper portion of the termination trench and by a second liner oxide layer in a bottom portion of the termination trench, the second liner oxide layer being formed between the second trench gate and the sidewall of the semiconductor layer on the first side in a lateral direction, the second liner oxide layer being thicker than the first sidewall oxide layer, the second trench gate being isolated from the sidewall of the semiconductor layer on a second, opposite side of the termination trench by a second sidewall oxide layer, a bottom of the second trench gate being isolated from a bottom of the termination trench by the second liner oxide layer having a second thickness greater than the first thickness.

2. The power MOSFET device of claim 1, wherein the first sidewall oxide layer in the termination trench is formed as a gate oxide layer same as the gate oxide layer formed in the active trench.

3. The power MOSFET device of claim 2 wherein the gate oxide layer and the first sidewall oxide layer are both formed by thermal oxidation of the semiconductor layer along the upper portion of the respective active trench and termination trench.

4. The power MOSFET device of claim 1, wherein the first liner oxide layer, the second liner oxide layer and the second sidewall oxide layer each comprises a high density plasma oxide layer.

5. The power MOSFET device of claim 1, further comprising:
 a body region of a second conductivity type formed in the semiconductor layer adjacent to the upper portion of the active trench and the first side of the termination trench;
 a source region of the first conductivity type formed in the body region and adjacent to the upper portion of the active trench and the first side of the termination trench; and
 a contact to the body region and the source region.

6. The power MOSFET device of claim 1, wherein the semiconductor layer comprises a lightly doped semiconductor substrate of the first conductivity type, the semiconductor substrate forming a drift region of the power MOSFET device, the power MOSFET device further comprising:
 a heavily doped drain contact region formed on a bottom portion of the semiconductor substrate.

7. The power MOSFET device of claim 1, wherein the second sidewall oxide layer of the termination trench has a thickness greater than a thickness of the second liner oxide layer formed on the first side of the termination trench.

8. The power MOSFET device of claim 1, wherein the second sidewall oxide layer of the termination trench has a thickness sufficient to provide edge termination for the power MOSFET device.

9. The power MOSFET device of claim 1, wherein the first conductivity type is N-type and a second conductivity type is P-type.

10. The power MOSFET device of claim 1, wherein the active trench houses a multiple oxide thickness trench gate structure including the first trench gate formed in the active trench, the first trench gate being isolated from the semiconductor layer by the gate oxide layer in the upper portion of the active trench and being isolated from the semiconductor layer by the first liner oxide layer in the bottom portion of the active trench, the first liner oxide layer forming a staggered oxide structure having increasing oxide thickness from the gate oxide layer to the bottom of the active trench.

11. The power MOSFET device of claim 1, wherein the termination trench houses a multiple oxide thickness trench gate structure including the second trench gate formed in the termination trench, the second trench gate being isolated from the semiconductor layer on the first side of the termination trench by the first sidewall oxide layer in the upper portion of the termination trench and by the second liner oxide layer in the bottom portion of the termination trench, the second liner oxide layer being thicker than the first sidewall oxide layer, the second trench gate being isolated from the semiconductor layer on the second, opposite side of the termination trench by the second sidewall oxide layer, the second liner oxide layer forming a staggered oxide structure on the first side of the termination trench having increasing oxide thickness from the first sidewall oxide layer to the bottom of the termination trench and the second sidewall oxide layer forming a staggered oxide structure having increasing oxide thickness on the second side of the termination trench.

12. The power MOSFET device of claim 1, wherein the active trench comprises a single polysilicon layer as the first trench gate inside the active trench.

13. The power MOSFET device of claim 1, wherein the termination trench comprises a single polysilicon layer as the second trench gate inside the termination trench.

14. A power metal-oxide-silicon field effect transistor (MOSFET) device, comprising:
 a semiconductor layer of a first conductivity type;
 an active trench formed in the semiconductor layer, the active trench having a first trench depth and housing a dual oxide thickness trench gate structure including a first trench gate formed in the active trench, the first trench gate being isolated from a sidewall of the semiconductor layer by a gate oxide layer in an upper portion of the active trench and being isolated from the sidewall of the semiconductor layer by a first liner oxide layer in a bottom portion of the active trench, the first liner oxide layer being formed between the first trench gate and the sidewall of the semiconductor layer in a lateral direction, the first liner oxide layer being thicker than the gate oxide layer, a bottom of the first trench gate being isolated from to a bottom of the active trench by the first liner oxide layer having a first thickness, the active trench housing only one polysilicon layer; and
 a termination trench formed in the semiconductor layer apart from the active trench, the termination trench having a second trench depth deeper than the first trench depth and housing a dual oxide thickness trench gate structure including a second trench gate formed in the termination trench, the second trench gate being isolated from the sidewall of the semiconductor layer on a first side of the termination trench by a first sidewall oxide layer in an upper portion of the termination trench and by a second liner oxide layer in a bottom portion of the termination trench, the second liner oxide layer being formed between the second trench gate and the sidewall of the semiconductor layer on the first side in a lateral direction, the second liner oxide layer being thicker than the first sidewall oxide layer, the second trench gate being isolated from the sidewall of the semiconductor layer on a second, opposite side of the termination trench by a second sidewall oxide layer, the second liner oxide layer extending from a bottom of the second trench gate to a bottom of the termination trench, by the second liner oxide layer having a second thickness, the termination trench housing only one polysilicon layer.

15. The power MOSFET device of claim 14, wherein the first sidewall oxide layer is formed as a gate oxide layer same as the gate oxide layer formed in the active trench.

16. The power MOSFET device of claim 15, wherein the gate oxide layer and the first sidewall oxide layer are both formed by thermal oxidation of the semiconductor layer along the upper portion of the respective active trench and termination trench.

17. The power MOSFET device of claim 14, wherein the first liner oxide layer, the second liner oxide layer and the second sidewall oxide layer each comprises a high density plasma oxide layer.

18. The power MOSFET device of claim 14, wherein the second thickness of the second liner oxide layer between the bottom of the second trench gate and the bottom of the termination trench is greater than the first thickness between the bottom of the first trench gate and the bottom of the active trench.

19. The power MOSFET device of claim 14, further comprising:
- a body region of a second conductivity type formed in the semiconductor layer adjacent to the upper portion of the active trench and the first side of the termination trench;
- a source region of the first conductivity type formed in the body region and adjacent to the upper portion of the active trench and the first side of the termination trench; and
- a contact to the body region and the source region.

20. The power MOSFET device of claim 14, wherein the second sidewall oxide layer of the termination trench has a thickness greater than a thickness of the second liner oxide layer formed on the first side of the termination trench.

* * * * *